APPARATUS FOR CUTTING AND BENDING WIRE LEADS

Filed March 1, 1967 2 Sheets-Sheet 1

INVENTORS
A. R. Anderson
B. J. Sadewicz
R. P. Miller
ATTORNEY

Dec. 3, 1968 A. R. ANDERSON ETAL 3,414,024

APPARATUS FOR CUTTING AND BENDING WIRE LEADS

Filed March 1, 1967 2 Sheets-Sheet 2

United States Patent Office 3,414,024

Patented Dec. 3, 1968

3,414,024
APPARATUS FOR CUTTING AND BENDING WIRE LEADS

Albin R. Anderson, Lowell, and Benjamin J. Sadewicz, Haverhill, Mass., assignors to Western Electric Company, Incorporated, New York, N.Y., a corporation of New York Filed Mar. 1, 1967, Ser. No. 619,764
9 Claims. (Cl. 140—1)

ABSTRACT OF THE DISCLOSURE

Component leads inserted through a printed circuit board are cut and bent by a slotted sleeve concentrically mounted on a slotted rod. The sleeve and rod are rotated relative to each other to simultaneously cut and then simultaneously bend in opposite directions one or more pairs of component leads.

*Background of the invention*

In the art of cutting and bending leads projecting from electrical components through holes in printed circuit boards, it is desirable to provide apparatus which will quickly and easily first cut the lead ends to desired lengths and then bend these leads in opposing directions to crimp them against the boards. The bending of lead ends in opposed directions provides a most facile way of attaching the components to the boards without resorting to a soldering operation. It is also desirable that the apparatus be usable for different components inserted into boards with different spacings between lead-receiving holes. Moreover, in certain applications, it may be desirable to perform first the cutting and then the bending operation simultaneously on all of the leads in two parallel rows of leads.

*Summary of the invention*

In accordance with the invention, a pair of cutter rods, located in a pair of slotted bending sleeves, are rotated to cut to a desired size the ends of wire leads projecting through a printed circuit board or support chassis and into the slotted sleeves. Thereafter, rotation of the bending sleeves about the cutter rods acts to bend the remaining portions of the leads in opposed directions and crimps these against the board.

According to one embodiment of the invention, these cutting and bending units are oriented to converge, varying the spacing between the units with axial displacement therealong. Thus, boards with holes at different spacings, varying the spacings between wire lead ends, may be accommodated by the apparatus.

According to another embodiment of the invention, parallel cutting and bending units, at a predetermined spacing therebetween, are used. Thus, all the leads in two parallel rows of leads at a similar spacing therebetween may be simultaneously cut and then simultaneously bent by the apparatus.

*Detailed description*

Figures 4, 5, 6, 7:
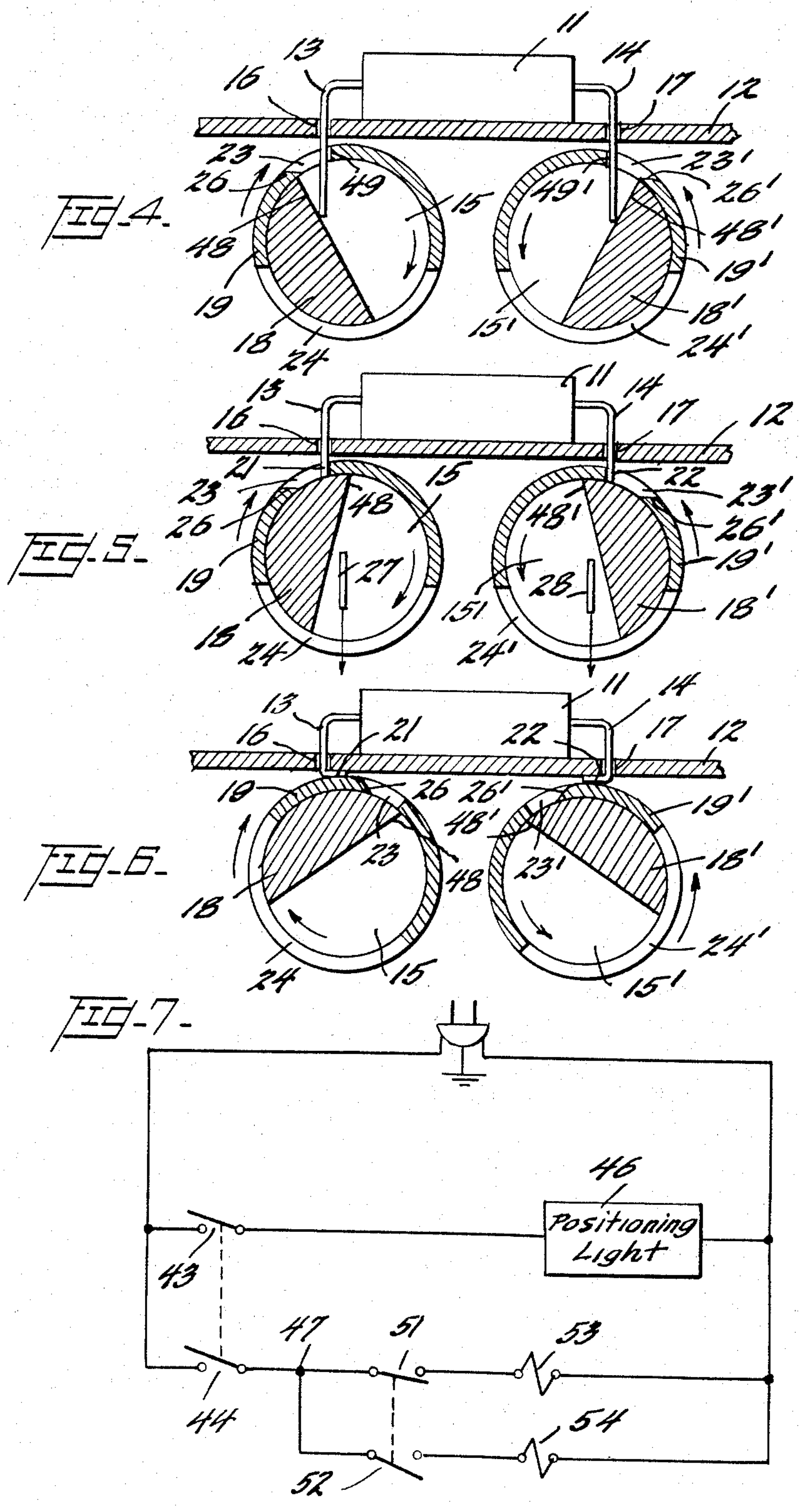
FIGS. 4–6 are views, partly in cross section, of successive stages in the operation of part of the apparatus showing a component inserted through a board with a pair of projecting wires being cut and bent by the sequential operation of the cutters and bending sleeves.
FIG. 7 is a diagram of a control circuit which may be used with the apparatus of the invention.

Referring to FIGS. 4–6, the general principle of the invention is illustrated. One or more electrical components 11 are mounted on a printed circuit board or support chassis 12 with a pair of bent leads or wires 13 and 14 (see FIG. 4) projecting through a pair of holes 16 and 17 in the board. A pair of rod-like slotted cutters 18 and 18′ (see FIG. 5) are rotated relative to a pair of concentric bending sleeves 19 and 19′ to cut the leads 13 and 14 to a desired size. As illustrated in FIG. 6, the uncut projecting portions 21 and 22 of the leads are bent or crimped against the board 12 through rotation of the bending sleeves 19 and 19′. The uncut projecting portions or ends 21 and 22 extend toward one another on the opposite side of the board 12 from the component 11, securely clamping the component to the board.

In FIGS 4–6, the cutters 18 and 18′ are shown as having cross sections which are segments of a circle somewhat smaller than semicircles. Actually, the cutters may be cylindrical rods with chordal slots 15 and 15′ therethrough which run axially along part of the rods. In the embodiment illustrated in FIG. 2, the cutting slots 20 and 20′ run diametrically through the rods. The rods 18 and 18′ have diameters substantially equal to the inner diameters of the surrounding sleeves 19 and 19′, with only a small clearance provided to permit relative rotation with minimum friction. The sleeves 19 and 19′ each have radially opposed openings or slots 23 and 24 (FIGS. 4–6) or 23′ and 24′ therethrough. The openings 23 and 23′ are bounded at the sides thereof most remote from each other sleeve by sloping walls 26 and 26′. The sloping walls 26 and 26′ serve to bent the lead ends 21 and 22 toward each other upon rotation of the sleeves 19 and 19′ after the lead cutting operation. The opening 24 and 24′ provide clearance through which cut portions 27 and 28 (FIG. 5) of the leads 13 and 14 may fall. A removable tray 29 (FIG. 2) is provided for catching the cut portions 27 and 28. The sleeves 19 and 19′ are supported within openings 30 and 30′ formed in a frame plate 31 and partially project upwardly through an upper surface thereof. A circuit board supporting or holding structure, such as supporting lugs 40 (FIGS. 1 and 2) on the frame plate 31, is also provided.

Figures 1, 2, 3:
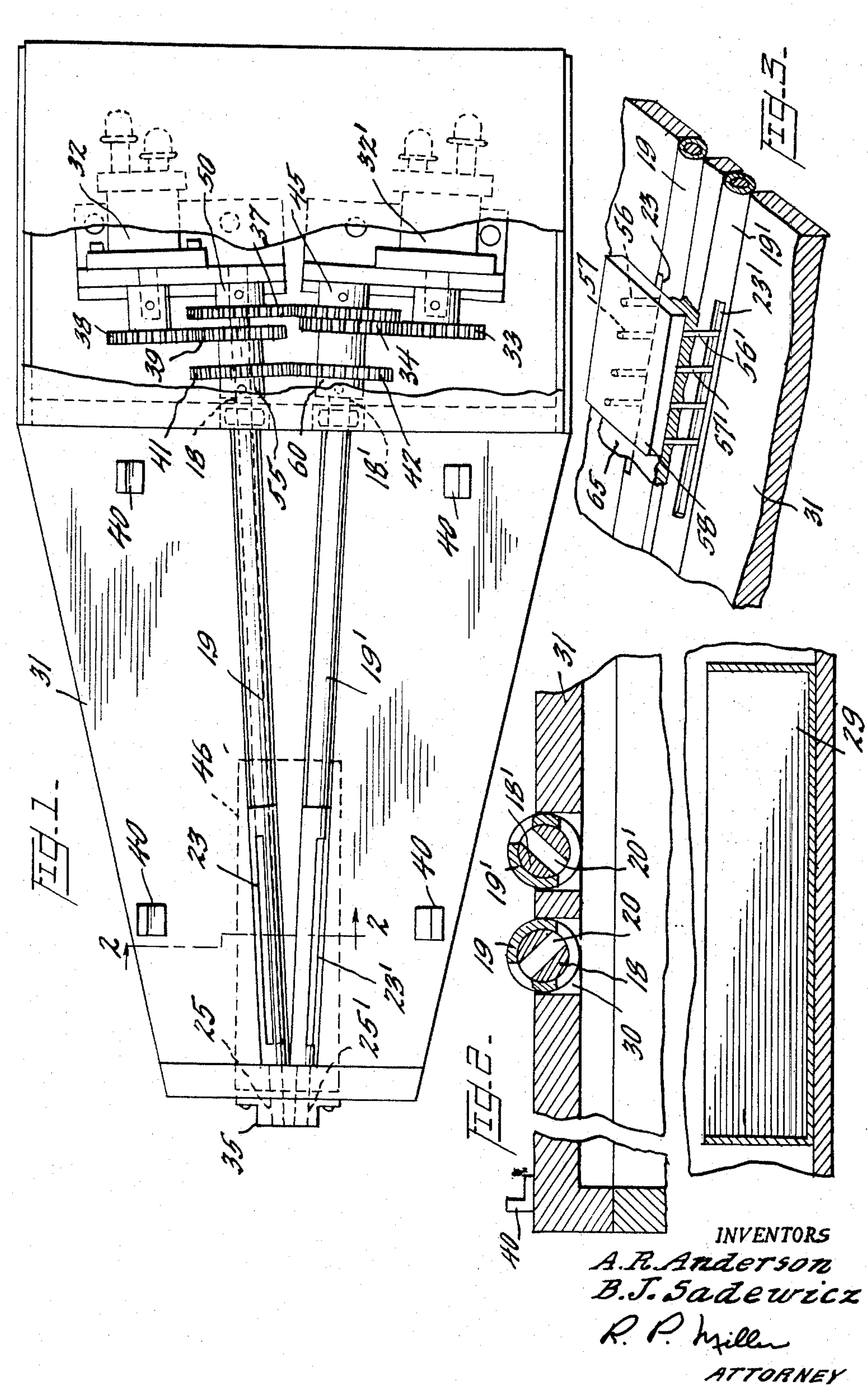
FIG. 1 is a plan view showing one embodiment of a wire cutting and bending apparatus constructed in accordance with the principles of the invention.
FIG. 2 is an enlarged, cross-sectional view taken along the line 2—2 in FIG. 1 showing a part of the apparatus including a pair of generally cylindrical cutters located within a pair of bending sleeves.
FIG. 3 is a perspective view of part of a second embodiment showing an article with two parallel rows of wire leads projecting into slots in two parallel cutter and bending sleeve units.

Turning now to FIGURE 1, an embodiment of the device is shown wherein the sleeves 19 and 19′ converge. Since the spacing between the cutting and bending units varies with axial position along the converging sleeves 19 and 19′, this embodiment is usable to cut and bend pairs of wire leads spaced apart by various distances. The forward or left-hand ends of the sleeves 19 and 19′ are supported in bearings 25 and 25′ mounted in a bracket 35.

The cutters 18 and 18′ and the sleeves 19 and 19′ are driven by a pair of reversible pneumatic motors 32 and 32′ which are operable through part of a single rotation and are controlled by a pair of conventional, solenoid-operated reversing valves (not shown). The motor 32′ is connected to rotate the cutters 18 and 18′ within the sleeves 19 and 19′ through the gears 33, 34, 36, and 37, the gears 36 and 37 being secured to hubs 45 and 50 which are keyed to the cutter rods 18′ and 18, respectively. The motor 32 is connected to rotate the sleeves 19 and 19′ through the gears 38, 39, 41, and 42, the gears 41 and 42 being secured to hubs 55 and 60 keyed to sleeves 19 and 19', respectively. Reversal of the pneumatic motors 32 and 32' acts to return the cutters 18 and 18' and the sleeves 19 and 19' to their initial positions.

In describing the operation of the embodiment of FIGURE 1, reference is now also made to FIGURE 7 which shows a control circuit for operating the motors. The attending operator first closes a ganged switch to close contact pairs 43 and 44. The closing of contacts 43 illuminates a positioning light 46. The closing of contacts 44 provides power to a junction 47.

The attending operator next positions the board 12, for example by hand, on the support lugs 40 over the upper surface of the frame 31 (FIGURE 1) close to the sleeves 19 and 19'. The holes 16 and 17 are located over the openings or slots 23 and 23' at a point at which the spacing between the openings corresponds to that between the holes. The positioning light 46 helps locate the holes in the board 12 over the openings. When the board is properly positioned, the light 46 will shine through the openings 24 and 24' and the openings 23 and 23', and will be observable through the holes 16 and 17. The board 12 is preferably translucent. Thus, the light through slots 23 and 23' will also pass through the board 12 to aid in the location of holes 16 and 17 in position for proper insertion at the desired center distance of holes 16 and 17. The component 11 is then positioned on the board 12 with the leads 13 and 14 projecting through the holes 16 and 17, through the openings 23 and 23', and into the sleeves 19 and 19' beside a cutting edge 48 or 48' on each cutter 18 or 18'.

Next, while the component 11 is held in position, the attending operator presses a foot pedal (not shown), or other known actuating mechanism to operate a conventional two-stage switch which first closes contacts 51 (FIGURE 7) and thereafter closes contacts 52. The closing of the contacts 51 energizes a solenoid 53, which operates the valve controlling the admission of air to the pneumatic motor 32'. The motor 32' is, thus, actuated and the cutter rods 18 and 18' are rotated in the sleeves 19 and 19' in the direction of the arrows in FIGURE 4 through the train of gears 33, 34, 36, 37, and hubs 45 and 50 (FIGURE 1). The portions of the leads 13 and 14 which extend into the sleeves 19 and 19' beside the cutting edges 48 and 48' of the cutters 18 and 18' are severed. The severing of lead ends takes place as the cutting edges 48 and 48' are rotated across the inner edges of a pair of flat walls 49 and 49' of the openings 23 and 23' opposite to the pair of sloping walls 26 and 26'. The severed lead ends 27 and 28 (FIGURE 5) fall through the openings 24 and 24' into the removable tray 29 (FIGURE 2).

The closing of the contacts 52, rapidly following the closing of the contacts 51 and the severing of the lead ends, energizes another solenoid 54. The solenoid 54 operates the valve controlling the pneumatic motor 32. The motor 32 drives the train of gears 38, 39, 41, and 42 to rotate the sleeves 19 and 19' in the direction of the arrows in FIG. 6. The sloping walls 26 and 26' contact the uncut portions of the lead wires 13 and 14 and bend these toward each other to crimp them against the face of the board 12 opposite that supporting the component 11.

The attending operator may now remove the board 12 from the support lugs 40 on the frame 31 with the component 11 securely attached to the board. The foot pedal may also be released, deenergizing the solenoids 53 and 54 and reversing the valve positions and the pneumatic motors 32 and 32' to return the cutter rods 18 and 18' and the bending sleeves 19 and 19' to their initial positions. The apparatus is now in condition to cut and bend the leads extending from another component inserted in a different pair of holes in the same or another board.

Referring now to FIG. 3, another embodiment is shown wherein all the leads in two parallel rows of leads

56, 57 . . . and 56', 57' . . . extending from a component or module 58 may be simultaneously cut and then simultaneously bent. For the sake of simplicity of illustration, a board 65 into which the rows of leads are inserted and about which the leads are to be bent is only partially shown. The embodiment of FIG. 3 corresponds to that of FIG. 1 except that the sleeves 19 and 19' and the cutter rods 18 and 18' located therein extend parallel to one another at a predetermined spacing therebetween. The openings 23 and 23', thus, also extend parallel to one another. Thus, the component 58 may be positioned so that the leads 56, 57 . . . and 56', 57' . . . project through the openings 23 and 23' and into the sleeves 19 and 19', respectively. The simultaneous cutting and then the simultaneous bending of all the leads in both rows may, therefore, take place in a manner similar to that described above in accordance with the illustration shown in FIGS. 4–6 of the drawing. Obviously, the principle of this embodiment may be employed for the simultaneous cutting and then the simultaneous bending of all the leads in three or more rows of leads or in a plurality of nonparallel rows of leads. This would merely entail the use of a number of cutting and bending units equal to that of rows of leads with the units arrayed similarly to the rows of leads.

It is understood that the above-described apparatus is simply illustrative of two embodiments of the invention. These embodiments, particularly that last described, are usable to cut and bend lead wires associated with components inserted into boards automatically, by machine rather than by hand. Many modifications may be made without departing from the invention. As one example, the unsevered lead portions 21 and 22 (FIG. 6) could be bent away from each other, rather than toward each other merely by reversing the locations of the boundary walls 26 and 49 or 26' and 49' of each opening 23 or 23' and operating the cutter rods 18 and 18' and the bending sleeves 19 and 19' in an opposite direction to that shown by the arrows in FIGS. 4–6. Further, the cutter rods 18 and 18' and sleeves 19 and 19' may be placed at different elevations to accommodate circuit boards or modules having stepped undersides.

We claim:

1. In a cutting device for severing a wire projecting from an article,
- a cutting and forming sleeve having a first peripheral slot extending therethrough, said slot being defined by forward and rear walls sloping toward each other and opening toward the periphery of said sleeve,
- a cylinder rotatably mounted within said sleeve having a slot aligned with said peripheral slot in said sleeve, said slot terminating a wall the peripheral edge of which forms a cutting edge,
- means for holding an article with a wire projecting into said slots,
- means for rotating said cylinder to move said cutting edge against said wire to sever the wire between said cutting edge and the lower edge of said forward wall of said sleeve slot, and
- means for rotating said sleeve to move said sloping rear wall of said sleeve slot against said severed wire to bend said wire against said article.

2. A device for cutting and bending a wire projecting from a surface of a module, comprising:
- a cylinder having a chordal slot,
- a sleeve concentrically mounted on said cylinder and having a pair of diametrically opposed radial slots, the forward and rearward walls of which define openings in register with said chordal slot so that a first of said slots may receive a section of said wire,
- means for rotating said cylinder to sever said section of wire against the forward wall of said first radial slot, and dispense said severed wire through said chordal slot and the other radial slot, and means for rotating said sleeve to move the rearward wall of said first radial slot to bend said unsevered wire against said surface of said module.

3. In an apparatus for cutting a pair of wires projecting from an article and bending the wire against the article:

a pair of spaced rotatable sleeves, each having first and second openings therethrough extending between outer and inner sleeve radii;

a pair of cutters, each mounted for rotation in an associated one of said sleeves and each having radius substantially equal to the inner radius of its associated sleeve;

means for holding said pair of wires with each wire projecting through a first opening in a sleeve and extending into said sleeve adjacent the associated cutter;

means for rotating said cutters to sever said wires adjacent each sleeve inner radius and drop the cut-off portions of said wires from said sleeves through said second openings therein; and means for rotating said sleeves to bend the uncut portions of said wires against said articles adjacent said sleeve outer radius.

4. Apparatus for cutting and bending wires, as set forth in claim 3, wherein means rotatably mount said spaced sleeves in angular relation with respect to each other with said first and second openings extending longitudinally along each sleeve so that the spacing between said openings varies with axial position along said sleeve.

5. Apparatus for cutting wires, as set forth in claim 3, wherein means rotatably mount said spaced sleeves in parallel relation to each other.

6. Apparatus for cutting and bending wires, as set forth in claim 3, wherein said sleeve rotating means comprises means for simultaneously rotating said sleeves in opposite directions to simultaneously bend the uncut portions of said wires in opposition.

7. Apparatus for cutting and bending wires, as set forth iin claim 3, wherein:

each sleeve bounds said first opening therethrough by a straight first wall and an opposite second wall sloping outwardly away from said first wall;

said cutter rotating means comprises means for rotating said cutters in opposite directions, said cutters severing said wires at an inner edge of each straight first wall; and said sleeve rotating means comprises means for simultaneously rotating said sleeves in said opposite directions, said sloping second walls simultaneously bending the uncut portions of said wires in said opposite directions.

8. Apparatus for cutting and bending wires, as set forth in claim 3, further including means for providing beams of light shining upwardly through said first and second openings in said sleeves adjacent said cutters generally toward said holding means.

9. In an aapparatus for cutting pairs of spaced wires and for bending uncut portions thereof:

a pair of rotatably mounted sleeves disposed in a plane at an angle with respect to one another, each sleeve having a peripheral slot therethrough and extending axially therealong at said angle between slots;

a pair of cutters each mounted for rotation in one of said sleeves and each having a cutting edge adjacent an edge of one of said slots;

means for positioning said wires one extending into each slot at a location whereat the spacing between slots corresponds to the space between said wires;

means for rotating said cutters while holding said sleeves fixed against rotation, the cutting edges of said cutters severing said wires at said edges of said slots; and means for rotating said sleeves to bend the uncut portions of said wires.

References Cited

UNITED STATES PATENTS

| | | | |
|---|---|---|---|
| 2,424,024 | 7/1947 | Garton | 72—338 |
| 2,591,203 | 4/1952 | Schmalz | 140—93 |
| 2,893,010 | 7/1959 | Stuhre | 140—1 |
| 2,971,544 | 2/1961 | Newman | 140—71 |
| 3,141,492 | 7/1964 | Petree et al. | 72—326 |

CHARLES W. LANHAM, *Primary Examiner.*

L. A. LARSON, *Assistant Examiner.*